US006751756B1

(12) United States Patent
Hartnett et al.

(10) Patent No.: US 6,751,756 B1
(45) Date of Patent: *Jun. 15, 2004

(54) FIRST LEVEL CACHE PARITY ERROR INJECT

(75) Inventors: Thomas D. Hartnett, Roseville, MN (US); John Steven Kuslak, Blaine, MN (US); Douglas A. Fuller, Eagan, MN (US)

(73) Assignee: Unisys Corporation, Blue Bell, PA (US)

( * ) Notice: Subject to any disclaimer, the term of this patent is extended or adjusted under 35 U.S.C. 154(b) by 510 days.

This patent is subject to a terminal disclaimer.

(21) Appl. No.: 09/727,610

(22) Filed: Dec. 1, 2000

(51) Int. Cl.[7] ................................................ G06F 11/00
(52) U.S. Cl. ............................ 714/54; 714/41; 714/49; 712/227
(58) Field of Search ............................ 714/54, 41, 49, 714/703; 712/227

(56) References Cited

U.S. PATENT DOCUMENTS

| 4,759,019 | A | | 7/1988 | Bentley et al. ................ 371/3 |
|---|---|---|---|---|
| 4,835,459 | A | | 5/1989 | Hamlin et al. ............. 324/73 R |
| 5,499,346 | A | * | 3/1996 | Amini et al. ................ 710/311 |
| 5,649,090 | A | * | 7/1997 | Edwards et al. ............. 714/10 |
| 5,872,910 | A | * | 2/1999 | Kuslak et al. ................ 714/41 |
| 2002/0162057 | A1 | * | 10/2002 | Talagala ...................... 714/54 |

* cited by examiner

Primary Examiner—Robert Beausoliel
Assistant Examiner—Yolanda L Wilson
(74) Attorney, Agent, or Firm—Charles A. Johnson; Mark T. Starr; Crompton Seager Tufte, LLC

(57) ABSTRACT

A system and method for selectively injecting parity errors into instructions of a data processing system when the instructions are copied from a read buffer to a first level cache. The parity errors are selectively injected according to programmable indicators, each programmable indicator being associated with one or more instructions stored in the read buffer. The error-injection system also includes programmable operating modes whereby error injection will occur during, for example, every copy back from the read buffer to the first level cache, or alternatively, during only a selected copy back sequence. The system allows for comprehensive testing of error detection and recovery logic in an instruction processor, and further allows for comprehensive testing of the logic associated with performing a data re-fetch from a second level cache or storage device.

20 Claims, 9 Drawing Sheets

FIRST LEVEL CACHE PARITY ERROR INJECT

BACKGROUND OF THE INVENTION

1. Technical Field of the Invention

This invention relates generally to error injection methods and apparatus used in testing electronic data processing systems, and more particularly, to the selective injection of parity errors into data resident within a data processor or memory for testing error detection and recovery systems.

2. Description of the Prior Art

In the past, errors have been injected into electronic circuits by probing circuit nodes to force connected circuitry to certain states indicative of errors. This can be done manually, or automatically. U.S. Pat. No. 4,759,019 to Bentley et al. discloses a programmable apparatus that injects errors by automatically short-circuiting voltage nodes within the system under test to ground or to a supply voltage in response to the system obtaining a particular state. U.S. Pat. No. 4,835,459 to Hamlin et al. describes a computer-controllable external device which, like the Bentley system, injects errors by applying voltage levels to pins or external circuit nodes of the unit under test. Error injection is triggered when a predetermined logic state exists on one or more of the externally-available circuit nodes.

Although straight-forward, the process of injecting errors by shorting circuit nodes can cause damage to circuits if voltage levels are not accurately applied. Moreover, this process is often not possible when highly integrated circuits are being tested, since most circuit nodes are not accessible to external probing devices. One common means of injecting errors into nodes that are not readily accessible involves the use of internal "scan-set" logic.

Scan-set logic usually includes a group of internal state devices which are interconnected to one another to form a shift register called a "scan string". Internal circuit nodes can be forced to logic levels by shifting (scanning) data into the scan strings from a device input to simulate an error condition. Generally, this scan will be performed after the system clock has been stopped. After the scan string is initialized to a particular state indicative of an error condition, the system clock is restarted. The injected error condition exercises the error detection and recovery logic.

Several complications exist with using scan strings to inject errors. Prior to injecting most errors using scan strings, the system clock must be halted as discussed above. This must be done at a precise time, so that the circuit is in the same logic state that would exist prior to a particular error occurrence during normal circuit operation. Stopping the clock so that the logic is in an exact state is difficult. Generally, it involves stopping the clock sometime before the logic is in the required state, then issuing single clock pulses until the logic is in the precise state. Calculating the required clock control, then administering that control during circuit test, is time-consuming and error-prone. Moreover, this process must be repeated for every error injected.

The above-described problems are accentuated when testing very complex circuits such as those associated with pipelined instruction processors. More specifically, testing parity-error detection and recovery logic in pipelined instruction processors has been particularly problematic in prior art systems for several reasons. In pipelined instruction processors, several instructions are in various stages of execution within the instruction processor at one time. If a parity error is detected on an instruction within the instruction processor, the instruction processor typically completes execution of all foregoing uncompleted instructions in the instruction stream, that is, the pipelined instruction processor is "de-piped". After the instruction processor is de-piped, the instruction that was corrupted is re-fetched from memory. Both the de-pipe and re-fetch processes require very complex logic sequences to perform. These sequences are dependent not only on the type of instructions which are resident in the pipeline at the time of the error, but also on the relative memory address of the re-fetched instruction.

The testing sequences may be further complicated when the instruction processor has one or more levels of cache memory. In many instruction processors, instructions are stored in two (or more) levels of cache memory including a second level cache that receives instructions from main memory, and a first level cache that provides the instructions into the instruction pipeline. In some instruction processors, a read buffer is also used. When a read buffer is used, a block of instructions are typically fetched from the second level cache and provided to the read buffer before the block of instructions are written to the first level cache. The read buffer is useful when, for example, the instruction processor uses certain prediction algorithms to predict which instructions will be needed in the future. Accordingly, when an instruction processor makes a request for a particular instruction, the instruction may reside in the main memory, the second level cache, the read buffer or the first level cache. Since it is often difficult to predict in advance where a particular instruction will reside when a request for the instruction is made, it can be difficult to write test procedures to test the error-detection and recovery logic for such instructions.

Instruction pre-fetch can also make it more difficult to test the error-detection and recovery logic of many data processing systems. During instruction pre-fetch, blocks of instructions are typically read up from the second level cache or main memory and stored in the read buffer and/or first level cache, before being supplied to the instruction processor. In some cases, the pre-fetched instructions are stored in an instruction queue in the instruction processor, which is useful in providing ready access to the pre-fetched instructions by the instruction pipeline. However, in such a system, it is often difficult to predict in advance where a particular instruction will reside when a request for the instruction is made. The requested instruction may reside in the instruction queue, the main memory, the second level cache, the read buffer or the first level cache. Accordingly, it is often difficult to write test procedures to test the error-detection and recovery logic for such instructions.

For many prior art data processing systems, such as those described above, completely testing the error-detection and recovery logic can require the execution of hundreds or even thousands of error injection test cases. Performing this testing using the scan-set and associated clock control operations described above is very time-consuming. As a result, many prior art systems required lengthy test schedules that are no longer feasible considering the short design cycles associated with modern-day development efforts.

SUMMARY OF THE INVENTION

According to the present invention, a system is provided for automatically injecting parity errors into instruction signals of a data processing system as the instructions are provided from a read buffer to a first level cache. The parity errors are selectively injected according to programmable indicators, each programmable indicator being associated with one or more instructions stored in the read buffer. The error-injection system also may include programmable operating modes whereby error injection will occur during, for example, every copy back from the read buffer to the first level cache, or alternatively, during only a selected copy back sequence. The system allows for comprehensive testing of error detection and recovery logic in an instruction processor, and further allows for comprehensive testing of the logic associated with performing a data re-fetch from the a second level cache or storage device.

In a preferred embodiment, the instruction processor is a pipelined instruction processor, although this is not required. Within the instruction processor, several instructions may be in various stages of execution at any given time. A parity error detection circuit is provided for detecting parity errors in instruction that are provided to the instruction processor. The detection of a parity error causes the instruction processor to complete execution of any other uncompleted instructions resident within the instruction processor pipeline before re-fetching the target instruction from memory. This is called "de-piping" the instruction processor pipeline. The sequences required to de-pipe the instruction processor, and to re-fetch the instruction from memory will vary based on the type of instructions present in the pipeline at the time the error occurred, the relative location of the target instruction within a predetermined block of storage in memory, and other factors.

To increase performance, the instruction processor may have one or more levels of cache memory. In one illustrative embodiment, instructions are stored in two levels of cache memory including a second level cache that receives instructions from a main memory, and a first level cache that provides instructions to the instruction pipeline. A read buffer is also provided. The read buffer receives blocks of instructions from the second level cache, and copies the instructions to the first level cache in an instruction copy back sequence. During operation, a block of instructions are first fetched from the second level cache and provided to the read buffer. The fetched instructions may then be provided to the instruction processor directly from the read buffer. During a subsequent fetch from the second level cache, the instructions stored in the read buffer are "copied back" to the first level cache before another block of instructions are loaded into the read buffer.

The error detection circuits of the instruction processor preferably provide an error signal when a parity error is detected in an instruction. Retry circuits are also provided for causing the instruction processor to discard the corrupted instruction and to again retrieve the discarded instruction from the second level cache or main memory in response to receiving the error signal.

To help test the error detection and retry circuits of the instruction processor, the present invention contemplates providing a parity error injection circuit coupled to the read buffer for selectively injecting parity errors into selected instructions as the instructions are provided from the read buffer to the first level cache during the copy back sequence. The parity error injection mechanism of the present invention may allow errors to be selectively injected into the instruction stream so that the error-recovery sequences of the instruction processor may be fully tested at full system clock speeds.

Preferably, the present invention allows parity errors to be selectively injected into instructions based on indicators which are programmed using, for example, a scanable interface. Selected indicators preferably specify one or more locations or words within the read buffer. The indicators are programmed based on predetermined test criteria. This allows the parity error injection tests to be tailored to obtain specific test coverage.

It is contemplated that the parity error injection system may have several modes of operation. In a first illustrative mode of operation, parity errors may be injected during a single copy back sequence. This is called the "single shot mode". During subsequent copy back sequences, no parity errors are injected. In a second illustrative mode of operation, called the "continuous mode", parity errors are continuously injected during all copy back sequences. In either of these modes, the programmable indicators may select only certain instructions in the block of instructions that are transferred from the read buffer to the first level cache. In addition, the programmable indicators may select specific parity bits within the selected instructions. The various operating modes of the invention preferably allow for complete test coverage of the many hardware sequences associated with parity error detection and recovery in a pipelined instruction processor.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
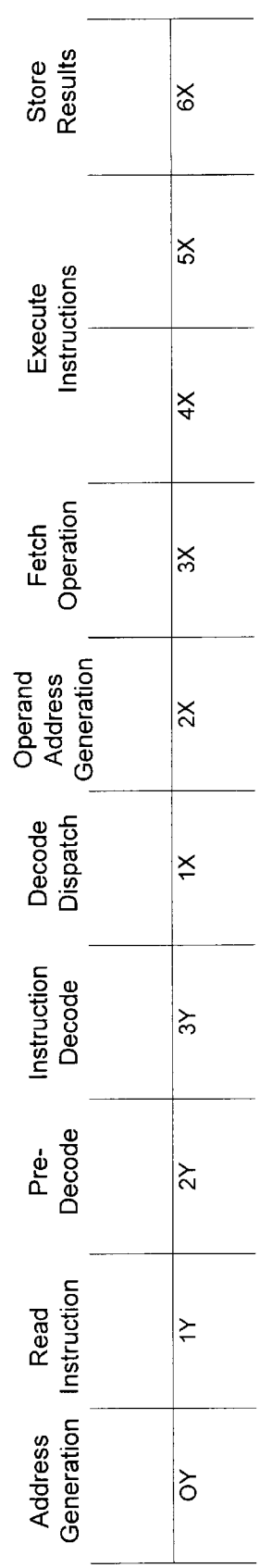
FIG. 1 is a timing diagram showing pipelined execution of an instruction by an exemplary Instruction Processor (IP)

FIG. 1 is a timing diagram showing pipelined execution of an instruction by an exemplary Instruction Processor (IP). Pipelined instruction execution is a method of increasing system throughput by dividing the execution of each instruction into functional operations that can be performed within different areas of the IP. Since each functional area of the IP can be processing somewhat independently from the other functional areas, the IP can be executing portions of several instructions at one time so that instruction execution is overlapped.

The timing diagram of FIG. 1 shows a standard instruction being divided into ten functional operations. Each of these functional operations may be referred to as stage of execution. During the first stage, designated as the "0Y" stage, address generation occurs for the instruction. Next, the instruction is retrieved from cache memory during the "1Y" stage. Following instruction retrieval, pre-decode of the instruction begins during the pre-decoded decode stage shown as "2Y". During stage "1Y", and "2Y", the instruction is staged in an instruction queue. Instruction decode begins in the "3Y" stage. During the "1X" stage, the decoded instruction signals are dispatched to the various logic sections of the IP that perform instruction execution. Stage "2X" is utilized primarily to generate any operand address that is required for instruction execution. During the "3X" stage, the operand address is used to fetch the operand from cache memory. Stages "4X" and "5X", respectively, are generally devoted to executing the operations specified by the decoded instruction, and the "6X" stage is used to store any results from the instruction execution.

In the pipeline architecture represented by the timeline of FIG. 1, stages 0Y, 1Y, 2Y, and 3Y are considered "instruction fetch" stages, and the actual instruction execution stages are the 1X through 6X stages. Since in this example, six standard instructions may be in instruction execution stages simultaneously during the 1X through the 6X stages, the illustrated pipeline architecture is said to represent a six-deep instruction pipeline. That is, while a first instruction undergoes decode dispatch during the 1X stage, operand address generation occurs for a second instruction during stage 2X. At the same time, operands for a third instruction are being retrieved, execution is occurring for fourth and fifth instructions, and any results produced by instruction execution are being stored for a sixth instruction.

Figure 2:
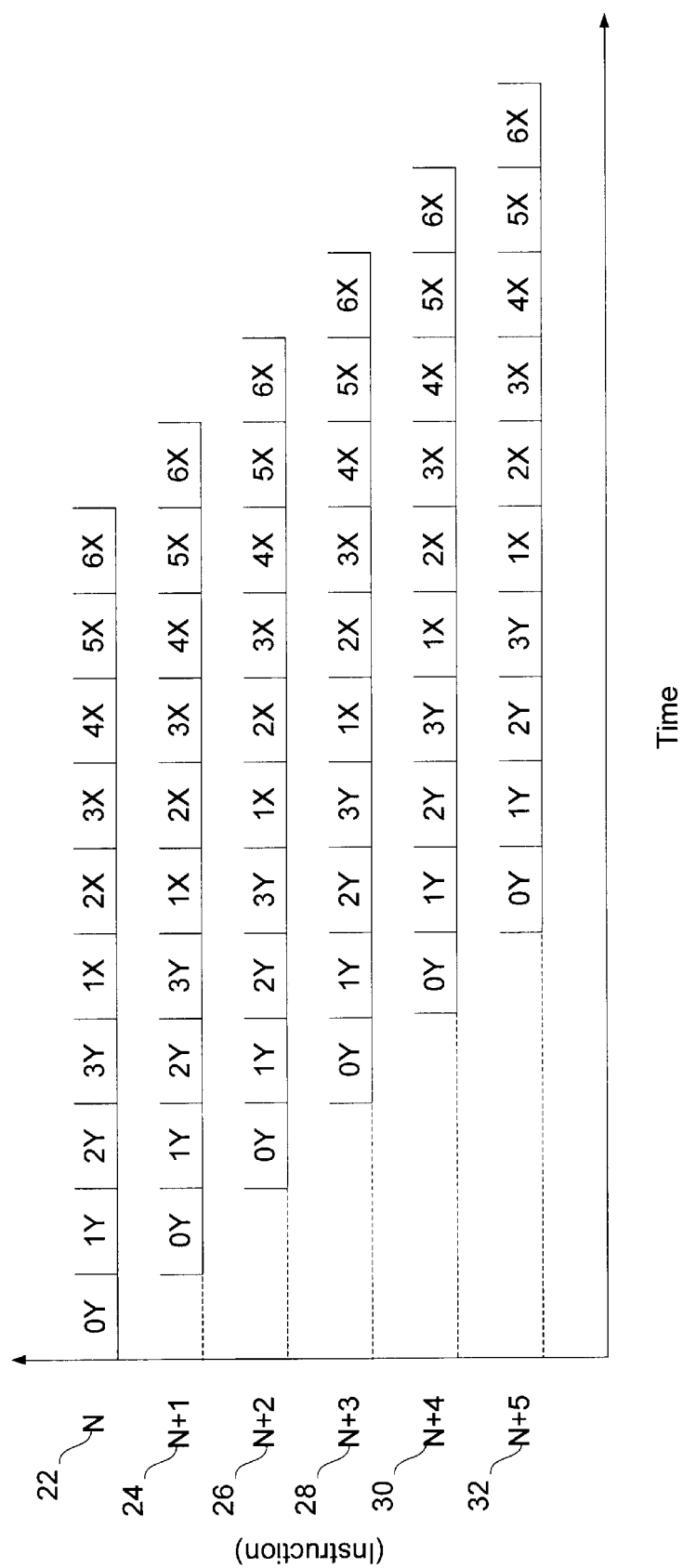
FIG. 2 is a timing diagram illustrating the pipeline instruction overlap of six consecutive standard instructions, N through N+5, in an instruction pipeline having the stages shown in FIG. 1.

FIG. 2 is a timing diagram illustrating the pipeline instruction overlap of six consecutive standard instructions, N through N+5, in an instruction pipeline having the stages shown in FIG. 1. Waveforms representing execution of these six instructions are labeled 22, 24, 26, 28, 30, and 32 respectively. The diagram represents fully overlapped execution for the four stages of instruction fetch 0Y through 3Y, and the six stages of instruction execution 1X through 6X. As stated above, during fully overlapped operation, one instruction completes every stage.

Figure 3:
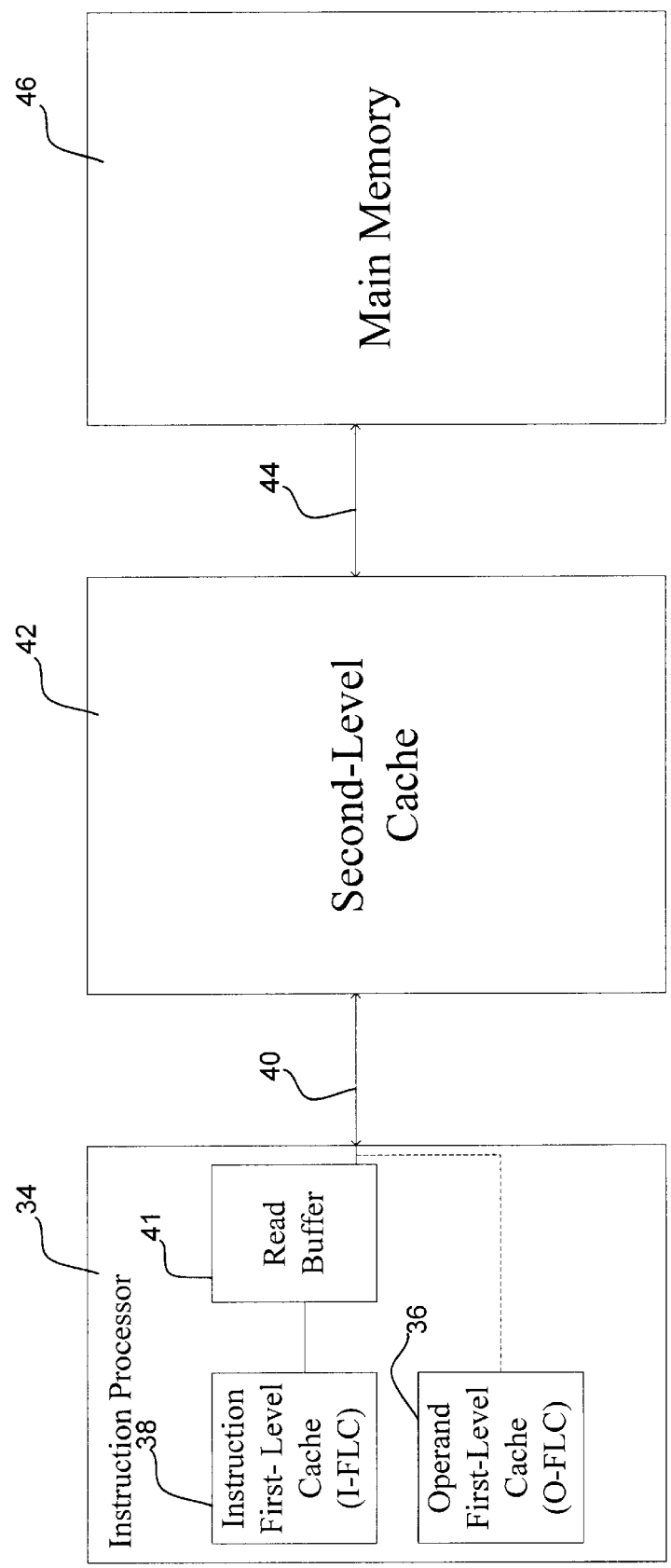
FIG. 3 shows an illustrative system environment that uses the present invention.

FIG. 3 illustrates the system environment of the current invention. The Instruction Processor (IP) 34 of the preferred embodiment includes an Operand First-Level Cache (O-FLC) 36, an Instruction First-Level Cache (I-FLC) 38 and a Read Buffer 41. The O-FLC 36, I-FLC 38 and Read Buffer 41 are relatively small and fast memories for storing recently-used operands and instructions, respectively, in a manner known in the art, to speed instruction execution within the IP 34.

The Read Buffer 41 and the O-FLC 36 are coupled via Interface 40 to a Second-Level Cache (SLC) 42, which stores both instructions and operands. Requests for instructions or operands are made to the SLC 42 when the instructions or operands are not located within the Read Buffer 41 or I-FIC 38, or the O-FLC 36, respectively. Similarly, the SLC 42 is coupled via Memory Interface 44 to additional storage shown as Main Memory 46. When a request is made to the SLC 42 for an item not stored in the SLC 42, the request is forwarded to Main Memory 46 for processing. In the preferred embodiment, Main Memory 46 includes both a third-level cache and a main storage unit. The implementation details of Main Memory 46 are beyond the scope of this application.

During use, if an instruction is not present in FLC 38 or Read Buffer 41, control circuitry within the Instruction Processor 34 requests that the SLC 42 provide a block of instructions that include the requested instruction to the Read Buffer 41. The Read Buffer 41 is preferably a set of holding registers, such as a set of eight holding registers. If the SLC 42 does not contain the proper instructions, the SLC 42 fetches the proper instructions from a Main Memory 46, as described above. After the SLC 42 provides the desired instructions to the Read Buffer 41, the Read Buffer 41 provides the requested instruction to the Instruction Processor 34. Before the SLC provides the desired instructions to the Read Buffer 41, however, the previous contents of the Read Buffer 41 are written to the FLC 38. Writing data from the Read Buffer 41 to the FLC 38 is often referred to as an instruction copy back. Each instruction in the block of data provided to the FLC 38 preferably has a predetermined number of parity bits associated therewith.

Instructions that are in the FLC 38 and Read Buffer 41 are available for decode and execution without making an instruction read request to the SLC 42. If the data is corrupted in the FLC 38 or Read Buffer 41, a request must be made to the SLC 42 for an uncorrupted copy of the instruction. This is referred to as instruction re-fetch. In a pipelined processor, if a corrupted instruction reaches the execution window and originated in the FLC 38 or Read Buffer 41, the pipeline may stall until the correct instruction is re-fetched.

Figure 4:
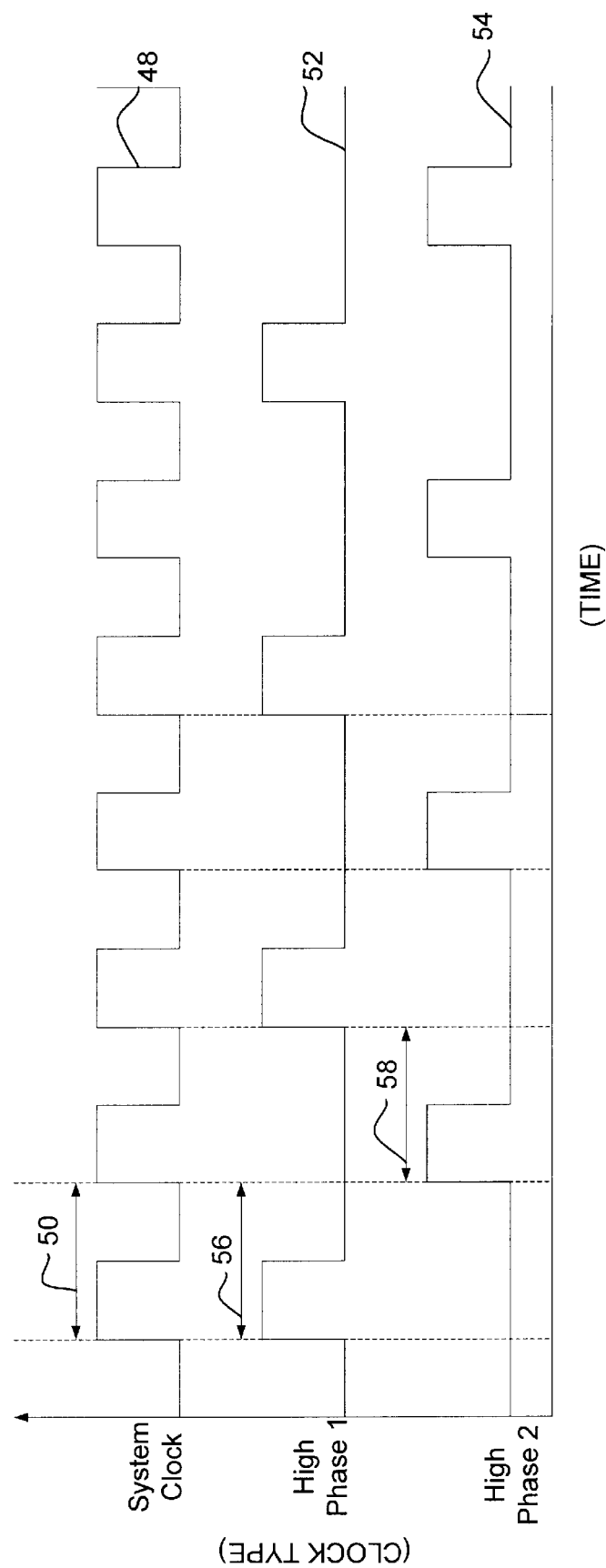
FIG. 4 is a timing diagram illustrating the clock signals associated with the IP logic of the preferred embodiment.

FIG. 4 is a timing diagram illustrating the clock signals associated with the IP logic of the preferred embodiment. The system clock shown in waveform 48 has a predetermined period 50. This system clock is used to generate all other clock signals in the system using a clock-generation scheme that is well-known in the art. Two of the clock signals used within the IP logic are represented by waveforms High Phase 1 52 and High Phase 2 54. The system clock periods associated with the high clock pulse of High Phase 1 and High Phase 2 can be referred to as Phase 1 56 and Phase 2 58 clock periods, respectively. The Instruction Processor of the preferred embodiment has a maximum pipeline depth of six. That is, up to six instructions may be undergoing instruction execution stages simultaneously in the IP. These are referred to as the 1X through the 6X stages. Additionally, four instruction fetch stages precede the instruction execution stages. These fetch stages are referred to as stages 0Y through 3Y.

Figure 5:
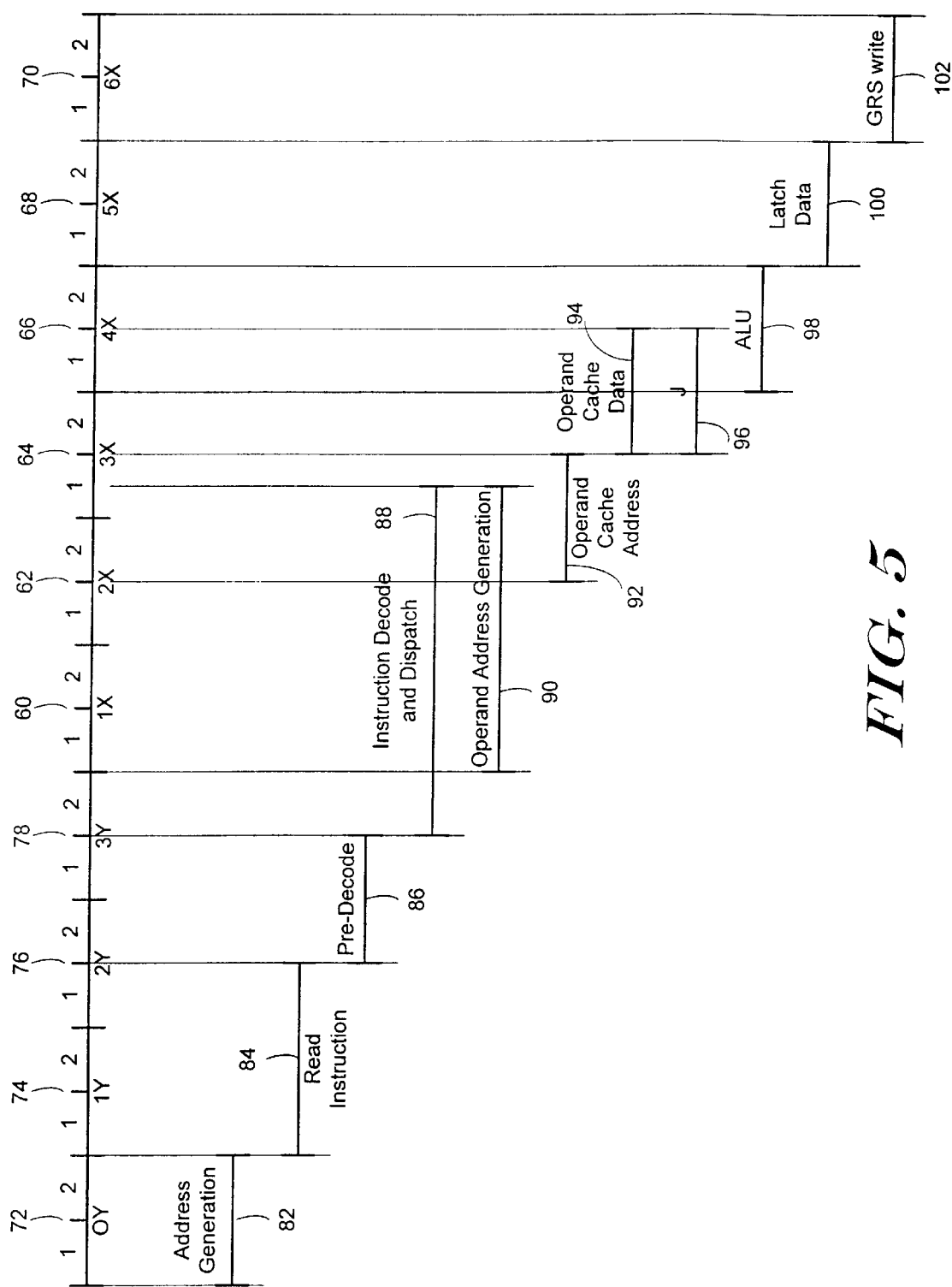
FIG. 5 is a timing sequence diagram illustrating the sequencing of a standard instruction through the instruction pipeline of the preferred embodiment.

FIG. 5 is a timing sequence diagram illustrating the sequencing of a standard instruction through the instruction pipeline of the preferred embodiment. The six execution stages 1X through 6X described above are labeled stages 60, 62, 64, 66, 68, and 70, respectively. The four additional instruction fetch stages 0Y through 3Y are labeled 72, 74, 76, and 78, respectively. Each of these stages is shown to have both a Phase 1 and a Phase 2 as is illustrated on Line 80. Hereinafter, a phase within one of the stages is referenced by indicating the stage followed by the phase. For example, phase 1 of stage 1X is referred to as "1X1".

As mentioned above and illustrated by Line 82, address generation for an instruction occurs in the 0Y stage. This address is used to fetch the instruction from memory. In most situations, when the addressed instruction is located in the I-FLC 38, the instruction is read from the I-FLC during the 1Y stage, as shown by Line 84. The instruction is provided to pre-decode logic that begins the instruction decode process in the 2Y stage, as illustrated by Line 86. Instruction decode continues during the 3Y stage, and decoded instruction signals are provided to various logic sections of the IP during the 1X stage. This is illustrated by Line 88. Additionally, operand address generation begins during the 1X stage for any operands required by the instruction as displayed by Line 90. By 2X2, the operand cache address is available for presentation to the O-FLC 36 as shown on Line 92. At 3X2, data from the O-FLC is available as illustrated by Line 94. Line 96 represents "per J shifting", which is an operation performed to determine whether the entire operand has been fetched.

At time 4X1, the Arithmetic Logic Unit (ALU) receives any fetched operand to be processed by the instruction, and also may receive operand data retrieved from one of the registers included within an internal IP register set called the General Register Set (GRS). The ALU processes the data during the 4X stage, and the results are latched during the 5X stage. This is shown by Lines 98 and 100, respectively. Finally, data is written back to the GRS during the 6X stage, as displayed by Line 102.

The timing sequence discussed above is a general illustration of the manner in which an instruction moves through the instruction pipeline of the preferred embodiment. The above discussion assumes that a standard (non-extended) instruction is being executed, and that the instruction requires some ALU processing to occur. It will be remembered that instruction sequences vary depending on the type of instruction being executed, and the functions and timing associated with the pipeline stages will therefore also vary somewhat between instructions. The above discussion also assumes the instruction was available in the I-FLC 38. If this is not the case, the instruction is retrieved from the SCL 42. If a request to the SLC 42 results in a cache miss, the instruction must be retrieved from the Main Memory 46. In either case, some processing delay may be introduced into the pipeline.

For more details on instruction decode in a pipelined data processing system, see U.S. Pat. No. 5,577,259 issued on Nov. 19, 1996, entitled "Instruction Processor Control System Using Separate Hardware and Microcode Control Signals to Control the Pipelined Execution of Multiple Classes of Machine Instructions", assigned to the assignee of the present invention and incorporated herein by reference.

As discussed above, FIG. 5 illustrates the execution of a "standard" (non-extended) instruction. This means that no additional microcode processing is necessary to complete execution of the instruction. Other instructions require that instruction execution be at least partially carried out under the control of a microsequencer with the IP. This microsequencer executes IP microcode that controls the various logic sections within the IP. When this type of execution is required, additional "extended-mode" stages must be inserted into the instruction processing time-line. This increases the time required for an instruction to complete execution, and also suspends the overlap of instruction execution within the IP pipeline.

Figure 6:
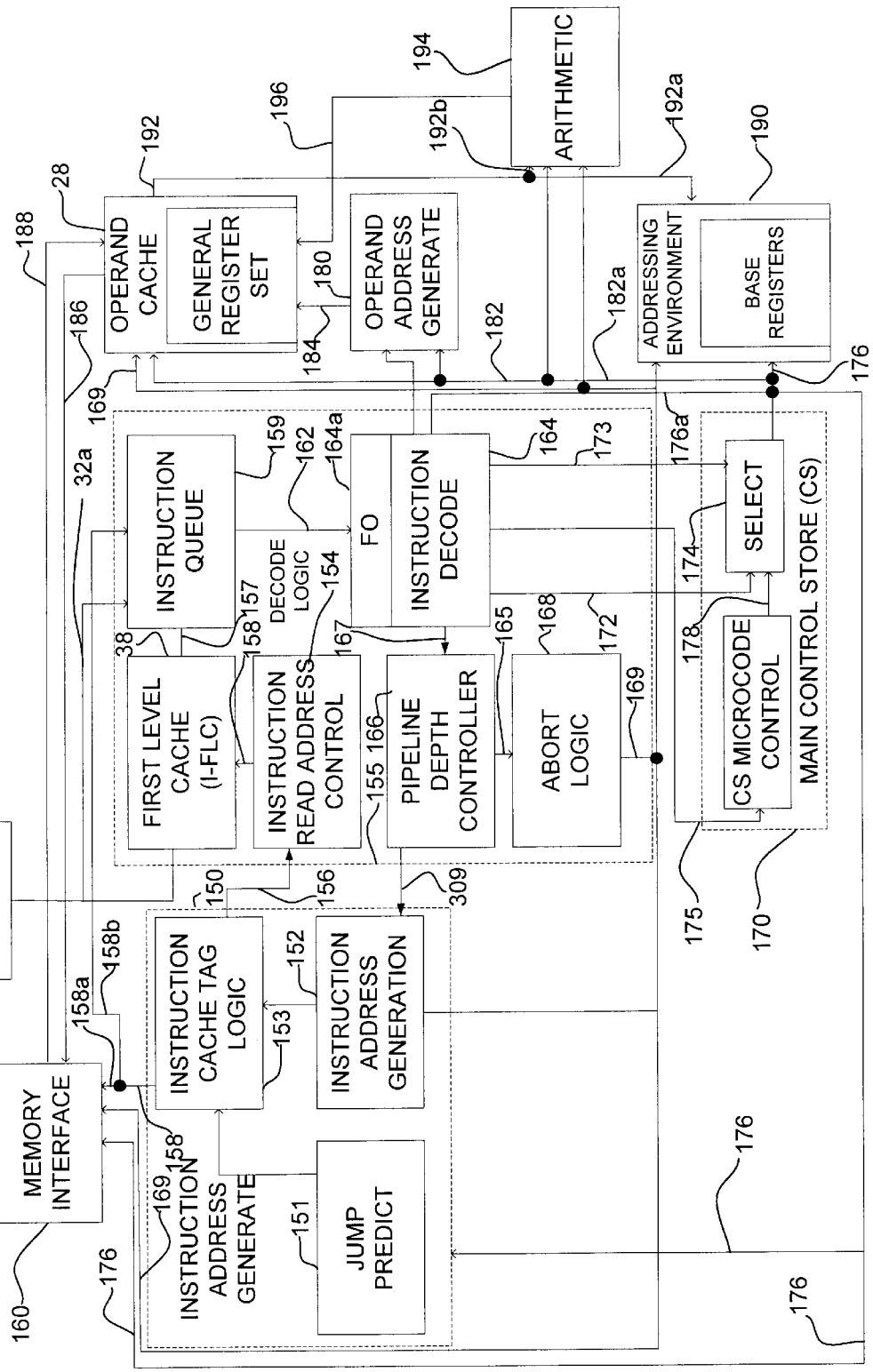
FIG. 6 is a block diagram of the major sections of an Instruction Processor of the preferred embodiment.

FIG. 6 is a block diagram of the major sections of an Instruction Processor of the preferred embodiment. Although this diagram does not provide a complete view of all data, addresses, and control paths, a subset of these paths is shown to facilitate an understanding of how the various IP sections interact.

During the 0Y stage, the IP of the preferred embodiment includes an Instruction Address Generate section 150 that provides logic that generates an absolute instruction address by adding a relative address to the address of a designated base register within the IP. A Jump Predict subsection 151, and an Instruction Address Generation subsection 152, provide absolute addresses to the Instruction Cache Tag Logic 153. The Instruction Cache Tag Logic 153 transfers the appropriate address to the Instruction Read Address Control logic 154, which resides in the Instruction Decode section 155, via interface 156. The Instruction Read Address Control logic 154 provides the address to the IP Instruction First-Level Cache (I-FLC) 38 on address path 156 to retrieve instructions, during the 1Y stage. If present, the instructions are transferred to the Instruction Queue 159 over lines 157 where they are staged to begin decode during the 2Y stage.

If a cache miss occurred, the IP suspends execution. Lines 158a communicate the miss to the IP Memory Interface 160, which initiates a memory request to the SLC 34 via Interface 32. The SLC 34 preferably provides a block of instructions that includes the requested instruction. The block of instructions are preferably provided to Read Buffer 41 via interface 32. Then, the requested instruction is provided on data path 32a to Instruction Queue 159. Before the block of instructions are provided to the Read Buffer 41, however, the previous contents of the Read Buffer 41 are provided to the I-FLC 38 to be cached.

Instruction Queue 159 includes one or more storage devices that queue up a predetermined number of instructions. Once in the Instruction Queue 159, the instruction is staged through a series of staging registers (not shown in FIG. 6), and begins decode. During the 3Y stage, partially decoded instruction signals are provided from the Instruction Queue 159 on lines 162 to the Instruction Decode section 164 at time 3Y2. The instruction is loaded into the instruction register F0 164a and during phase 2 of stage 1X. Decode continues during the 1X stage. The instruction decode subsection 164 contains both hardware and microcode decode logic, as will be discussed in more detail below.

The Instruction Decode subsection 164 provides pipeline depth control signals to the Pipeline Depth Controller 166 over lines 167 during stage 1X. The Pipeline Depth Controller 166 uses these signals to adjust the depth of the IP pipeline. The Pipeline Depth Controller 166 interfaces with the Abort Logic section 168 and Instruction Decode subsection 164 via Pipeline Control signal 165. Together, the Pipeline Depth Controller 166 s and the Abort Logic section 168 control the execution of all other logic sections over lines 169 so that the depth of the IP pipeline is set to between one and six instructions deep.

The Instruction Decode subsection 164 further provides various control signals to the Main Control Store (CS) section 170, which is a microcode-controlled sequencer. Control signals 172 for controlling the IP pipeline are provided to two-to-one Select logic 174. Selection control for the two-to-one Select logic 174 is provided by the Select CS Control Signal 173. The Select CS Control Signal 173 selects control signals 172 during all stages of standard instruction execution. Control signals 172 are thereby provided to all logic sections via the IP pipeline control lines 176 and 176a to control standard instruction execution.

Control signals 172 are also selected on the IP pipeline control lines 176 for the 1X stage during execution of extended-mode instructions. During all subsequent stages of extended-mode instruction execution, however, the microcode-controlled signals 178 are selected by the Select CS Control Signal 173 at two-to-one Select logic 174, and are provided to all logic sections to control instruction execution. The execution of extended-cycle instructions will be described in more detail below.

The hardware control signals generated by the Instruction Decode subsection 164 include addresses for the General Register Set (GRS) 36a. These addresses are provided over lines 182 to the Operand Address Generate section 180. During the 2X stage, the Operand Address Generate section 180 then generates a 24-bit operand absolute address, which is transferred to the Operand Cache (O-FLC) 36 on lines 184.

During the 3X stage, the operand absolute address is used to fetch the operand from cache memory. Specifically, after the absolute operand address has been received by the O-FLC 36, the O-FLC logic determines whether the operand is resident in the O-FLC 36. If the operand is not resident, the IP suspends instruction execution and initiates a memory read using a real address generated by the O-FLC 36. This real address is transferred over lines 186 to the Memory Interface 160, which then controls the memory request to the SLC 42 over the Interface 40. After the operand is returned on Interface 40 to Memory Interface 160, the operand is provided to the O-FLC 36 on lines 188.

If an O-FLC hit occurs, or after execution has resumed in the case of an operand cache miss, the operand data is available at 3X2 time. This data is provided to the Addressing Environment logic 190 over path 192a, where it is used in conjunction with the addressing signals provided on lines 182a to generate the next operand cache address. Operand data is further made available over lines 192b to the Arithmetic section 194 during the end of the 3X stage. The Arithmetic section 194 performs the multiply/divide, floating point, and decimal arithmetic operations for the machine during the 4X stage, and the results are latched during the 5X stage. During the 6X stage, the results are stored back to the GRS 36a in Operand Cache 36 over lines 196.

Figure 7:
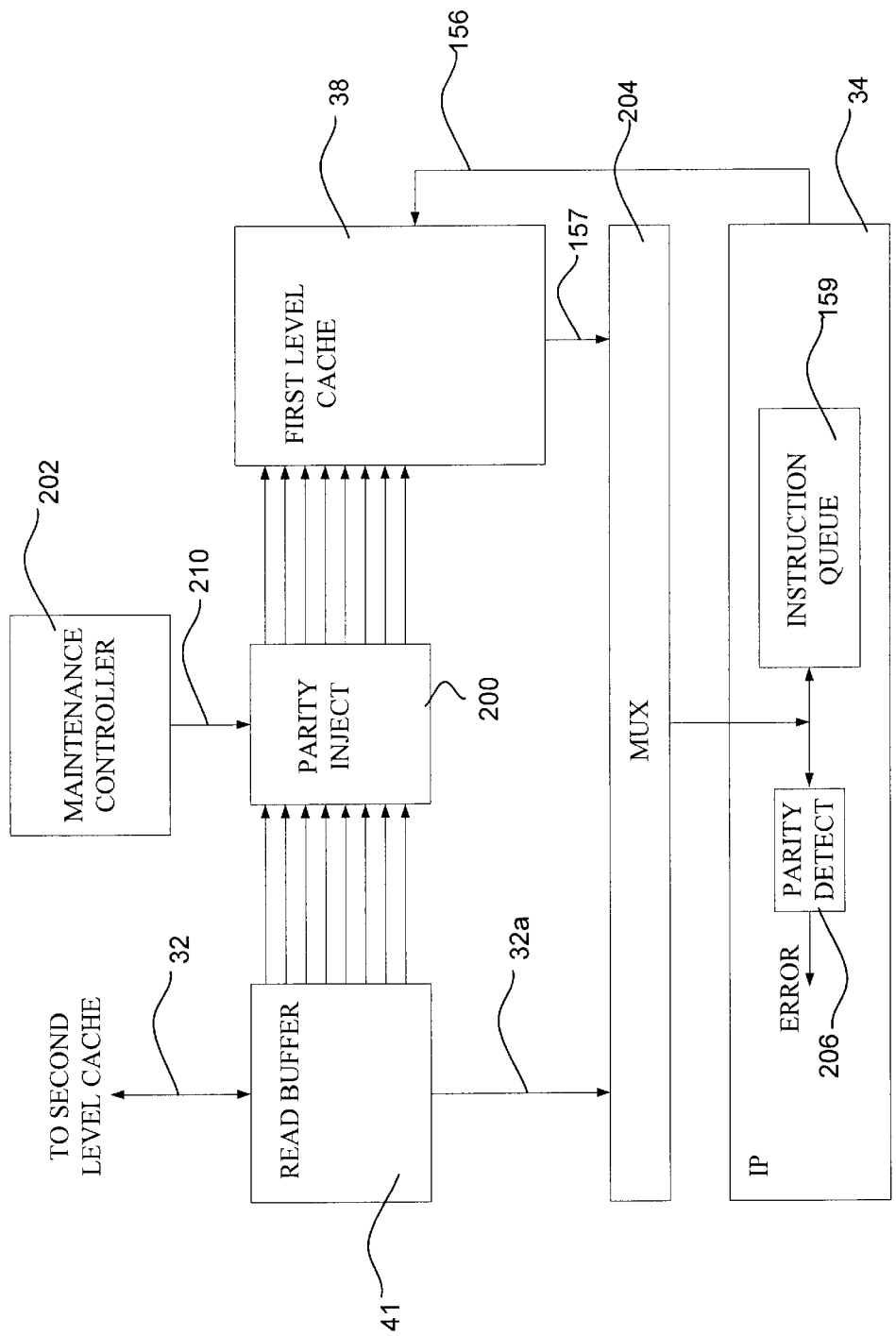
FIG. 7 is a block diagram showing an illustrative Parity Injection Block provided between the Read Buffer and the First Level Cache in accordance with the present invention.

FIG. 7 is a block diagram showing an illustrative Parity Injection Block provided between the Read Buffer 41 and the FLC 38 in accordance with the present invention. As indicated above, the Instruction Read Address Control logic 154 of FIG. 6 provides an address to the IP Instruction First-Level Cache (I-FLC) 38 on address path 156 to retrieve instructions. If present, the instructions are transferred to the Instruction Queue 159 over lines 157 where they are staged to begin decode during the 2Y stage. The output of the FLC 38 passes through a multiplexer 204, which selects the output of the FLC 38 rather than the output of the Read Buffer 41.

If a cache miss occurs, the IP suspends execution. Lines 158a of FIG. 6 communicate the miss to the IP Memory Interface 160, which initiates a memory request to the SLC 34 via Interface 32. The SLC 34 provides a block of instructions that includes the requested instruction. The block of instructions are provided to Read Buffer 41 via interface 32. Before the block of instructions is provided to the Read Buffer 41, however, the previous contents of the Read Buffer 41 are "copied back" to the I-FLC 38 to be cached. The requested instruction is then provided from the Read Buffer 41 to the Instruction Queue 159 via multiplexer 204.

The instruction processor preferably has a parity Error Detection block 206 for providing an error signal in response to detecting a parity error in a corrupted instruction. Retry circuits, which include abort logic 168, instruction address generate block 150, and other circuits are also provided for causing the instruction processor to discard the corrupted instruction and to again retrieve the discarded instruction from the SLC 34 or main memory in response to receiving the error signal.

To help test the Error Detection block 206 and retry circuits of the instruction processor, the present invention contemplates providing a Parity Error Injection Circuit 200 between the Read Buffer 41 and the FLC 38. The Parity Error Injection Circuit 200 selectively injects parity errors into selected instructions as the instructions are provided from the Read Buffer 41 to the FLC 38 during the instruction copy back sequence. As such, the Parity Error Injection Circuit 200 of the present invention provides a system that allows errors to be selectively injected into the instruction stream so that the error-recovery sequences of the instruction processor may be tested at full system clock speeds.

Preferably, the Parity Error Injection Circuit 200 allows parity errors to be selectively injected into the instruction stream based on indicators which are programmed from a maintenance controller 202 using, for example, a scanable interface 210. In one illustrative embodiment, selected indicators identify one or more locations, words or instructions stored in the Read Buffer 41. Other indicators may identify specific parity bits within the identified locations, words or instructions stored in the Read Buffer 41. During use, the user programs the indicators based on predetermined test criteria. This allows the user to tailor parity error injection tests to obtain specific test coverage.

Preferably, the user first initializes the programmable indicators to obtain the desired test cover. Then, the instruction processor is allowed to begin instruction execution. Alternatively, the user may initialize the programmable indicators while the instruction processor is executing, if desired, and then begin parity error injection at a predetermined time or at a predetermined event. In either case, as instructions are provided from the Read Buffer 41 to the FLC 38, parity errors are selectively injected into the instructions as they are "copied back" to the FLC 38. Then, when instructions from the FLC 38 are requested by the instruction processor, the Error Detection 206 and the retry circuits can be tested.

Preferably, the illustrative parity error injection system allows for several modes of operation. In a first mode, termed the "single shot mode", parity errors are injected during a single copy back sequence. During subsequent copy back sequences, no parity errors are injected. In a second mode of operation, termed the "continuous mode", parity errors are continuously injected during all copy back sequences. In either of these modes, the programmable indicators may select only selected instructions in the block of instructions that are copied from the Read Buffer 41 to the FLC 38. In addition, the programmable indicators may select only certain parity bits of each instruction. The various operating modes of the invention allow for complete test coverage of the many hardware sequences associated with parity error detection and recovery in a pipelined instruction processor.

Figure 8:
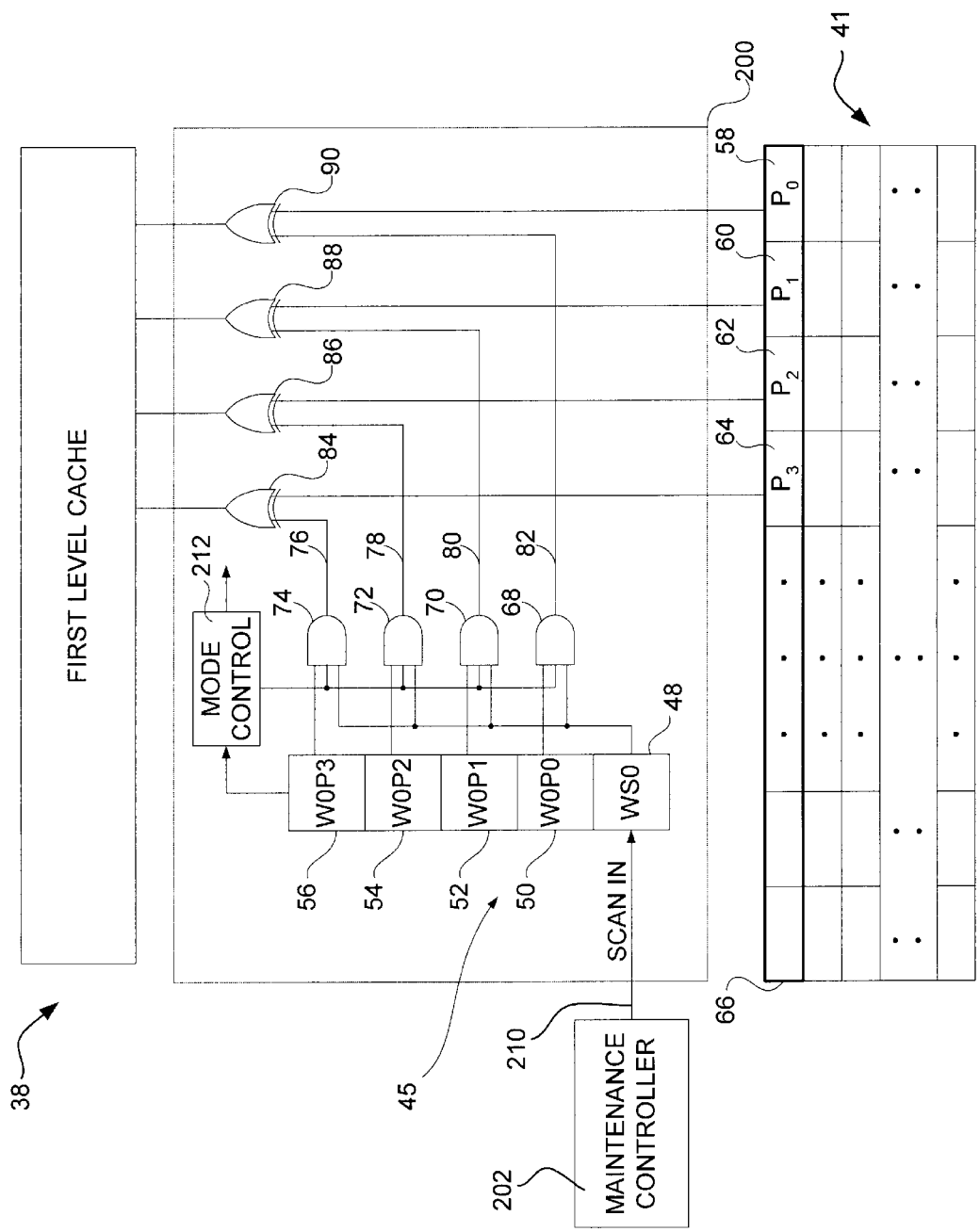
FIG. 8 is a more detailed schematic diagram of the Parity Injection Block of FIG. 7, showing the circuitry used for one word or instruction of the Read Buffer.

FIG. 8 is a more detailed schematic diagram of the Parity Injection Block 200 of FIG. 7, showing the circuitry used for one word or instruction 66 of the Read Buffer 41. Preferably, there is similar logic 200 provided for each word or instruction in Read Buffer 41.

The illustrative Parity Injection Block 200 includes a Dynamic Scan Register generally shown at 45. Programmable indicators can be scanned into Register 45 by means of maintenance controller 202. Register 45 may include a number of storage elements, each for storing a different programmable indicator. In the example shown, a first storage element 48 stores a word select indicator. The word select indicator is programmed high when it is desirable to be injected with one or more parity errors into the corresponding word or instruction in Read Buffer 41. The notation "WS0" is used to indicate that storage element 48 stores the "Word Select" indicator for word "0" of Read Buffer 41.

Storage elements 50, 52, 54 and 56 each store a parity bit selection indicator. In the example shown, each word, such as word 66, has four parity bits 58, 60, 62 and 64. Storage elements 50, 52, 54 and 56 each store a parity bit selection indicator that corresponds to parity bits 58, 60, 62 and 64, respectively. The parity bit selection indicators allow the user to select which parity bits of a particular word will be injected with errors. The notation "W0PX" is used to indicate that storage elements 50, 52, 54 and 56 each store a parity bit selection indicator for parity bit "Y" for word "0" of Read Buffer 41.

Finally, mode control block 212 preferably includes one or more mode control bits. The mode control bits are used by the mode control block 212 to control the mode of operation for the particular word. As indicated above, two illustrative modes include the "single shot mode" and the "continuous mode". During the "single shot mode", the mode control block 212 may enable "AND" gates 68, 70, 72 and 74 for only a single copy back sequence. In contrast, during the "continuous mode", the mode control block 212 may enable "AND" gates 68, 70, 72 and 74 continuously.

The word select indicator 48 is provided to each AND gate 68, 70, 72, and 74. Thus, the word select indicator 48 provides an enable to the parity error injection logic. The parity bit selection indicators 50, 52, 54, 56 are provided to a corresponding one of the AND gates 68, 70, 72, and 74. The outputs 76, 78, 80, and 82 of AND gates 50, 52, 54, and 56 are provided to XOR gates 84, 86, 88, and 90, respectively. The values of parity bits 58, 60, 62, and 64 of word "0" 66 are provided to the other input of XOR gates 84, 86, 88, and 90, respectively. The resulting operation of fault injection block is that the value of the parity bits 58, 60, 62, and 64 are toggled if the corresponding parity bit selection indicator is enabled (set high). Once the selected bits have been toggled, the data is provided to FLC 38. Thus, word Select indicator 48 provides a means for selecting a particular word stored in Read Buffer 41, while parity bit selection indicators 50, 52, 54, 56 provide a means for selecting which parity bits 58, 60, 62, and 64 in the selected word are injected with an error.

Figure 9:
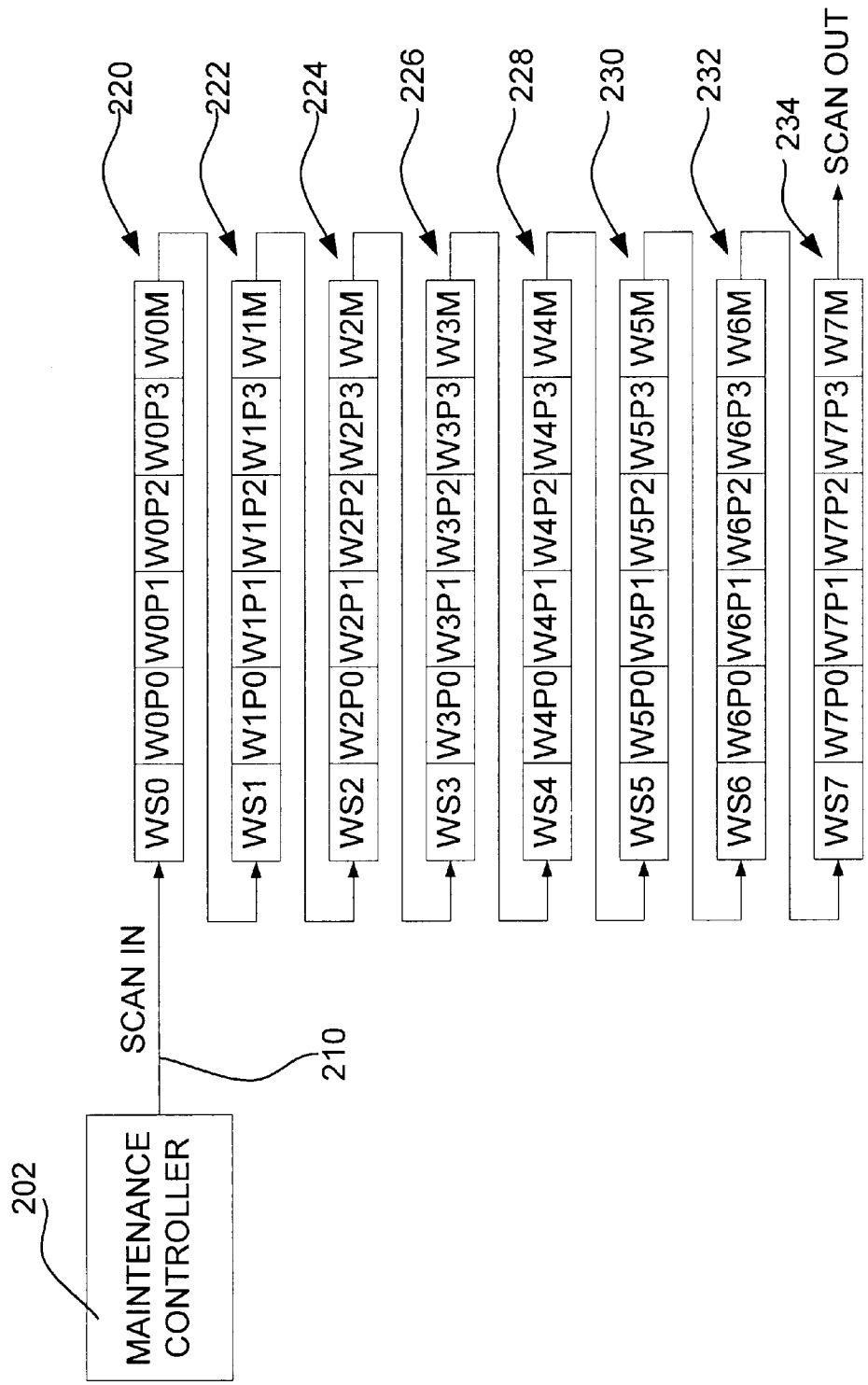
FIG. 9 shows an illustrative scan string to program the programmable indicators for an eight word Read Buffer, where each word has four parity bits.

FIG. 9 shows an illustrative scan string that may be used to program the programmable indicators for an eight word Read Buffer 41, where each word has four parity bits. The programmable indicators for words 0, 1, 2, 3, 4, 5, 6, and 7 are shown at 220, 222, 224, 226, 228, 230, 232 and 234, respectively. In the illustrative embodiment, each word "X" in the Read Buffer 41 has six programmable indicators; a "Word Select" indicator (WSX), four parity bit selection indicators (W[0–4]) and a mode select indicator (WXM). The storage elements that store these programmable indicators may be arranged into a scan string, as shown. The maintenance controller 202 can then be used to dynamically scan in the appropriate programmable indicators for all words in the Read Buffer 41.

Having thus described the preferred embodiments of the present invention, those of skill in the art will readily appreciate that the teachings found herein may be applied to yet other embodiments within the scope of the claims hereto attached.

What is claimed is:

1. In a data processing system having an instruction processor, a storage system, a read buffer and a first level cache, the instruction processor retrieving stored instruction from the storage system and storing the retrieved instructions in the read buffer, with the instructions previously stored in the read buffer provided to the first level cache, the instruction processor selecting and executing instructions from the first level cache and read buffer, and retrieving one or more instructions from the storage system if a desired instruction is not currently stored in the first level cache or read buffer, the instruction processor further having error detection circuits for providing an error signal in response to detecting a parity error in a corrupted instruction, and retry circuits for causing the instruction processor to discard the corrupted instruction and to again retrieve the discarded instruction from the storage system in response to receiving the error signal, a selectable error injection system, comprising:

programmable storage means for storing identifiers, each identifier specifying respective predetermined ones of the stored instructions in the read buffer; and corruption means coupled to the read buffer and to said programmable storage means for selectively corrupting said predetermined ones of the stored instructions when said stored instructions are provided from the read buffer to the first level cache.

2. The selectable error injection system of claim 1, wherein each said identifier identifies a predetermined location within the read buffer.

3. The selectable error injection system of claim 1, further comprising mode selection means coupled to said corruption means for selectively enabling said corruption means.

4. The selectable error injection system of claim 3, wherein said mode selection means includes selection means for selectively enabling said corruption means for all transfers of instructions from the read buffer to the first level cache.

5. The selectable error injection system of claim 3, wherein said mode selection means includes selection means for selectively enabling said corruption means during a single transfer of instructions from the read buffer to the first level cache.

6. In a pipelined data processing system having an instruction processor for simultaneously executing a first instruction, decoding a second instruction, and pre-fetching a number of instructions including a third instruction from an associated storage system, the instruction processor retrieving instruction from the storage system and storing the instructions initially in a read buffer, with the instructions previously stored in the read buffer provided to a first level cache, the instruction processor selecting desired instructions from the first level cache and read buffer for execution, and pre-fetching one or more instructions from the storage system if a desired instruction is not currently stored in the first level cache or read buffer, the instruction processor having error detection circuits for detecting and handling parity errors on the instructions selected for execution and further having an error injection system for testing the error detection circuits, the error injection system comprising:

programmable storage means for selectively storing a plurality of instruction identifying signals, each of said plurality of instruction identifying signals for specifying respective predetermined ones of the instructions stored in the read buffer; and error injection means coupled to the read buffer and to said programmable storage means for automatically injecting parity errors into said respective predetermined ones of the stored instructions in the read buffer when said respective predetermined ones of the stored instructions are provided from the read buffer to the first level cache.

7. The error injection system of claim 6, wherein each of said plurality of instruction identifying signals identify a predetermined location within the read buffer.

8. The error injection system of claim 6, further comprising mode selection means coupled to said error injection means for selectively enabling said error injection means.

9. The error injection system of claim 8, wherein said mode selection means includes selection means for selectively enabling said error injection means for all transfers of instructions from the read buffer to the first level cache.

10. The error injection system of claim 8, wherein said mode selection means includes selection means for selectively enabling said error injection means during a single transfer of instructions from the read buffer to the first level cache.

11. For use in a data processing system having an instruction processor for executing a predetermined set of machine instructions, and having a storage device, a read buffer and a first level cache for storing predetermined ones of the machine instructions, the data processing system retrieving machine instruction from the storage device and initially storing the retrieved machine instructions in the read buffer, with the machine instructions previously stored in the read buffer provided to the first level cache, the data processing system selecting and executing machine instructions from the first level cache and read buffer, and retrieving one or more machine instructions from the storage device if a desired machine instruction is not currently stored in the first level cache or read buffer, the data processing system further having parity error detection circuits for detecting a parity error associated with a corrupted one of the machine instructions that has been provided to the instruction processor, and further having re-fetch logic circuits for discarding the corrupted one of the machine instructions and for re-fetching it from the storage system, the parity error injection system, comprising:

a programmable storage device to store selector signals indicative of selected ones of the machine instructions stored in the read buffer; and error injection circuits coupled to the read buffer and said programmable storage device for injecting parity errors in said selected ones of the machine instructions stored in the read buffer when said selected ones of the stored machine instructions are provided from the read buffer to the first level cache.

12. The parity error injection system of claim 10, wherein each of said selector signals identify a predetermined location within the read buffer.

13. The parity error injection system of claim 10, further comprising mode selection means coupled to said error injection circuits for selectively enabling said error injection circuits.

14. The error injection system of claim 12, wherein said mode selection means includes selection means for selectively enabling said error injection circuits for all transfers of instructions from the read buffer to the first level cache.

15. The error injection system of claim 12, wherein said mode selection means includes selection means for selectively enabling said error injection circuits during a single transfer of instructions from the read buffer to the first level cache.

16. In a data processing system having an instruction processor, a second level cache, a read buffer and a first level cache, the instruction processor retrieving selected machine instructions from the second level cache and initially storing the retrieved machine instructions in the read buffer, with the machine instructions previously stored in the read buffer provided to the first level cache, the instruction processor selecting and executing machine instructions from the first level cache and read buffer, and retrieving one or more machine instructions from the second level cache if a desired machine instruction is not currently stored in the first level cache or read buffer, the instruction processor including error checking circuits to check for parity errors in machine instructions selected for execution, and error notification circuits to signal the occurrence of parity errors, and further including re-fetch logic circuits to re-fetch a machine instruction if a parity error is detected, a method for testing the data processing system comprising:

selectively storing error injection indicators, wherein each error injection indicator is indicative of one or more associated locations in the read buffer;

fetching selected ones of the machine instructions from the second level cache to the read buffer, copying the machine instructions stored in the read buffer to the first level cache during a copy back sequence, and during the copy back sequence, injecting one or more parity errors into those machine instructions that are stored in the locations indicated by the error injection indicators;

selecting one of the machine instructions stored in the first level cache for execution by the instruction processor;

checking said selected machine instruction for the presence of a parity error.

17. A method according to claim 16, further comprising:

re-fetching said selected machine instruction from the second level cache and providing the instruction to the read buffer if said checking steps indicate the occurrence of a parity error;

providing said selected machine instruction form the read buffer to the instruction processor for execution;

checking said selected machine instruction for the presence of a parity error;

signaling the occurrence of an error if said second checking step indicates the occurrence of a parity error; and operating on said selected machine instruction if said second checking step does not indicate the presence of a parity error.

18. A method according to claim 16, further comprising:

returning to said fetching step.

19. A method according to claim 16, wherein said injecting step injects one or more parity errors during all copy back sequences.

20. A method according to claim 16, wherein said injecting step injects one or more parity errors only during selected copy back sequence.

* * * * *